United States Patent
Gu

(10) Patent No.: US 7,361,578 B2
(45) Date of Patent: Apr. 22, 2008

(54) METHOD TO FORM LARGE GRAIN SIZE POLYSILICON FILMS BY NUCLEI-INDUCED SOLID PHASE CRYSTALLIZATION

(75) Inventor: Shuo Gu, San Antonio, TX (US)

(73) Assignee: Sandisk 3D LLC, Milpitas, CA (US)

( * ) Notice: Subject to any disclaimer, the term of this patent is extended or adjusted under 35 U.S.C. 154(b) by 17 days.

(21) Appl. No.: 11/614,915

(22) Filed: Dec. 21, 2006

(65) Prior Publication Data

US 2007/0105305 A1    May 10, 2007

Related U.S. Application Data

(60) Continuation of application No. 10/767,525, filed on Jan. 29, 2004, now Pat. No. 7,227,188, which is a division of application No. 10/391,142, filed on Mar. 17, 2003, now Pat. No. 6,713,371.

(51) Int. Cl.
*H01L 21/76* (2006.01)
(52) U.S. Cl. ........................ 438/482; 438/486
(58) Field of Classification Search ............... 438/592, 438/482, 486, 488, 166
See application file for complete search history.

(56) References Cited

U.S. PATENT DOCUMENTS

| | | | |
|---|---|---|---|
| 5,343,066 A * | 8/1994 | Okamoto et al. | 257/393 |
| 5,457,058 A * | 10/1995 | Yonehara | 438/479 |
| 5,693,959 A * | 12/1997 | Inoue et al. | 257/66 |
| 5,713,279 A * | 2/1998 | Iida et al. | 101/128.4 |
| 5,753,541 A | 5/1998 | Shimizu | |
| 5,821,152 A * | 10/1998 | Han et al. | 438/398 |
| 5,893,747 A * | 4/1999 | Yang | 438/592 |
| 5,923,968 A | 7/1999 | Yamazaki et al. | |
| 5,959,314 A * | 9/1999 | Voutsas | 257/65 |
| 6,005,270 A * | 12/1999 | Noguchi | 257/315 |
| 6,031,263 A * | 2/2000 | Forbes et al. | 257/315 |
| 6,121,120 A | 9/2000 | Wakabayashi et al. | |

(Continued)

FOREIGN PATENT DOCUMENTS

JP    03-060026    3/1991

OTHER PUBLICATIONS

Bo, Xiang-Zheng et al., "Spatialy Selective Single-Grain Silicon Films Induced by Hydrogen Plasma Seeding", J. Vac. Sci, Technol. B 20(3), 2002, pp. 818-921.

(Continued)

*Primary Examiner*—Roy Potter
(74) *Attorney, Agent, or Firm*—Foley & Lardner LLP

(57) ABSTRACT

A method to enhance grain size in polysilicon films while avoiding formation of hemispherical grains (HSG) is disclosed. The method begins by depositing a first amorphous silicon film, then depositing silicon nuclei, which will act as nucleation sites, on the amorphous film. After deposition of silicon nuclei, crystallization, and specifically HSG, is prevented by lowering temperature and/or raising pressure. Next a second amorphous silicon layer is deposited over the first layer and the nuclei. Finally an anneal is performed to induce crystallization from the embedded nuclei. Thus grains are formed from the silicon bulk, rather than from the surface, HSG is avoided, and a smooth polysilicon film with enhanced grain size is produced.

6 Claims, 4 Drawing Sheets

U.S. PATENT DOCUMENTS

| | | | |
|---|---|---|---|
| 6,146,966 | A | 11/2000 | Hirota et al. |
| 6,190,949 | B1 | 2/2001 | Noguchi et al. |
| 6,191,011 | B1 | 2/2001 | Gilboa et al. |
| 6,204,156 | B1 * | 3/2001 | Ping .................. 438/488 |
| 6,249,020 | B1 | 6/2001 | Forbes et al. |
| 6,249,126 | B1 * | 6/2001 | Lin .................... 324/427 |
| 6,271,134 | B1 | 8/2001 | Ha et al. |
| 6,387,779 | B1 | 5/2002 | Yi et al. |
| 6,391,749 | B1 | 5/2002 | Park et al. |
| 6,593,624 | B2 * | 7/2003 | Walker ................ 257/344 |
| 6,992,349 | B2 * | 1/2006 | Lee et al. ............. 257/324 |
| 7,195,992 | B2 * | 3/2007 | Gu et al. ............. 438/487 |
| 2001/0001211 | A1 | 5/2001 | Tanaka et al. |
| 2001/0032997 | A1 | 10/2001 | Forbes et al. |
| 2002/0084535 | A1 | 7/2002 | Lee et al. |

OTHER PUBLICATIONS

Subramanian, Vivek et al., "Controlled Two-Step Solid-Phase Crystallization for High-Performance Polysilicon TFTs", IEEE Electron Device Letters vol. 18, Issue 8, Aug. 1997, 1997, pp. 378-381.

Yamauchi, N. et al., "Polycrystalline silicon thin films processed with silicon ion implantation and subsequent solid-phase crystallization: Theory, experiments, and thin-film transistor applications", Journal of Applied Physics, vol. 75, 1994, pp. 3235-3257.

* cited by examiner

METHOD TO FORM LARGE GRAIN SIZE POLYSILICON FILMS BY NUCLEI-INDUCED SOLID PHASE CRYSTALLIZATION

CROSS-REFERENCE TO RELATED APPLICATIONS

This application is a continuation of Gu, U.S. Patent Publication 20040183073, "Large Grain Size Polysilicon Films Formed by Nuclei-Induced Solid Phase Crystallization," filed Jan. 29, 2004, which is a divisional of Gu, U.S. Pat. No. 6,713,371, both hereby incorporated by reference.

BACKGROUND OF THE INVENTION

The invention relates to a method to enhance grain size in polycrystalline silicon, called polysilicon. Larger grain size in polysilicon is advantageous for many uses, particularly in thin film transistors (TFTs).

One of the major obstacles to the use of polysilicon thin film as a semiconductor in active devices is the relatively small grain sizes (around 0.05 micron or less) of polysilicon thin films deposited by such methods as low-pressure chemical vapor deposition and sputtering. A film with small grain size has a larger number of grain boundaries, decreasing carrier mobility. Typical electron mobilities in polysilicon films made using these methods are on the order of 10 $cm^2$/volt-second, two orders of magnitude lower than electron mobilities in bulk silicon.

The poor electrical performance caused by grain boundaries in the channel region limits the use of TFTs largely to low-temperature flat panel displays. It is believed that electrical properties of TFTs can be improved if the grain size is enhanced and the number of grain boundaries in the channel region minimized.

There is a need, therefore, to enhance grain size in polysilicon thin films.

SUMMARY OF THE INVENTION

The present invention is defined by the following claims, and nothing in this section should be taken as a limitation on those claims. In general, the invention is directed to a method to enhance grain size in polysilicon films while avoiding formation of hemispherical grains.

A preferred embodiment provides for a method for crystallizing silicon, the method comprising embedding deposited silicon nuclei within a matrix of amorphous silicon and crystallizing from the embedded silicon nuclei.

Another preferred embodiment provides for a method for crystallizing silicon. The method comprises depositing a first layer of amorphous silicon; depositing silicon nuclei on the first layer of amorphous silicon; depositing a second layer of amorphous silicon over the first layer and the nuclei, wherein conversion of the first layer to hemispherical grains before deposition of the second layer is substantially prevented; and annealing the first and second layers of amorphous silicon to induce crystallization. A related embodiment provides for a thin film transistor comprising polysilicon, wherein the polysilicon is formed by such a method.

In a different preferred embodiment, a monolithic three dimensional memory array comprising memory cells, said memory cells comprising polysilicon, is provided for. In this embodiment, any of said polysilicon is crystallized by a method comprising embedding deposited silicon nuclei between layers of amorphous silicon and crystallizing from the embedded silicon nuclei. A related embodiment provides for a thin film transistor comprising a channel region formed by a method comprising embedding deposited silicon nuclei between layers of amorphous silicon; and annealing the nuclei and amorphous silicon layers.

Another embodiment provides for a method for crystallizing silicon, the method comprising depositing a first layer of amorphous silicon, depositing silicon nuclei on the first layer of amorphous silicon, changing conditions to inhibit formation of hemispherical grains, depositing a second layer of amorphous silicon over the first layer and nuclei, and annealing the nuclei and silicon layers.

Other preferred embodiments are provided, and each of the preferred embodiments can be used alone or in combination with one another.

The preferred embodiments will now be described with reference to the attached drawings.

DETAILED DESCRIPTION OF THE INVENTION

Enhancing grain size in polysilicon films to be used in TFTs minimizes the number of grain boundaries, which in turn improves carrier mobility, and thus device performance. Several methods have been employed to increase grain size in polysilicon films.

Laser annealing of polycrystalline or amorphous silicon has been used to improve carrier mobilities, but it is difficult to determine and control the temperature of thin films during laser anneal, and substrates can be thermally damaged by this process.

Metal-induced crystallization has shown great promise in increasing grain size. Metal nuclei or patterned strips deposited or formed on the surface of amorphous silicon seed formation of silicon grains. This method may lead to metal contamination, however, which degrades device performance.

It is known in the DRAM industry to use silicon nuclei to induce crystallization of amorphous silicon, eliminating the risk of metal contamination. In Han et al., U.S. Pat. No. 5,821,152, for example, silicon nuclei are deposited on the surface of amorphous silicon to induce crystallization.

Figure 1A:
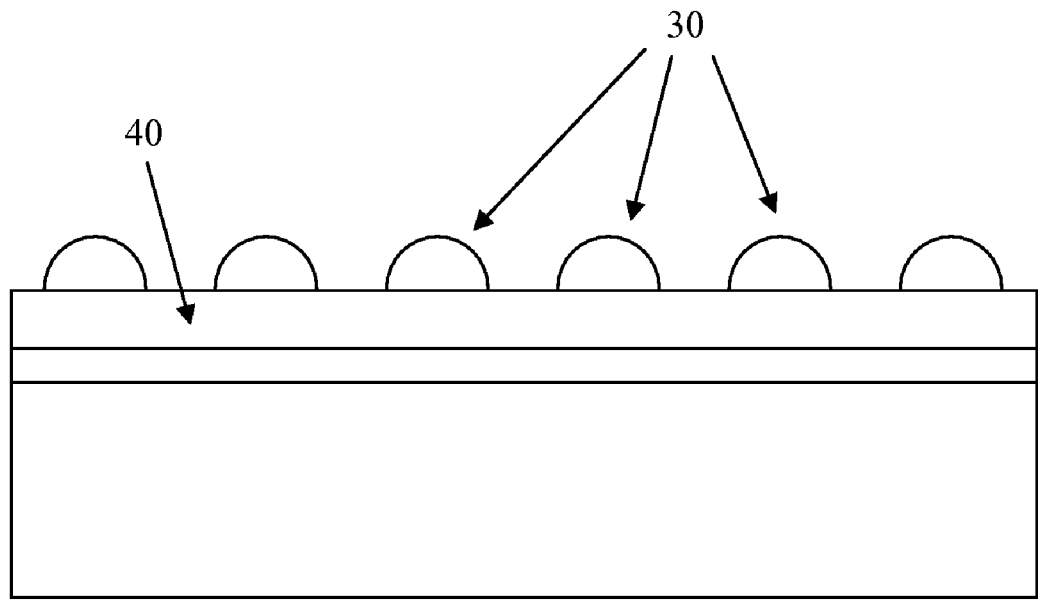
FIGS. 1a and 1b illustrate growth of hemispherical grain silicon, which is substantially avoided by the present invention.
Figure 1B:
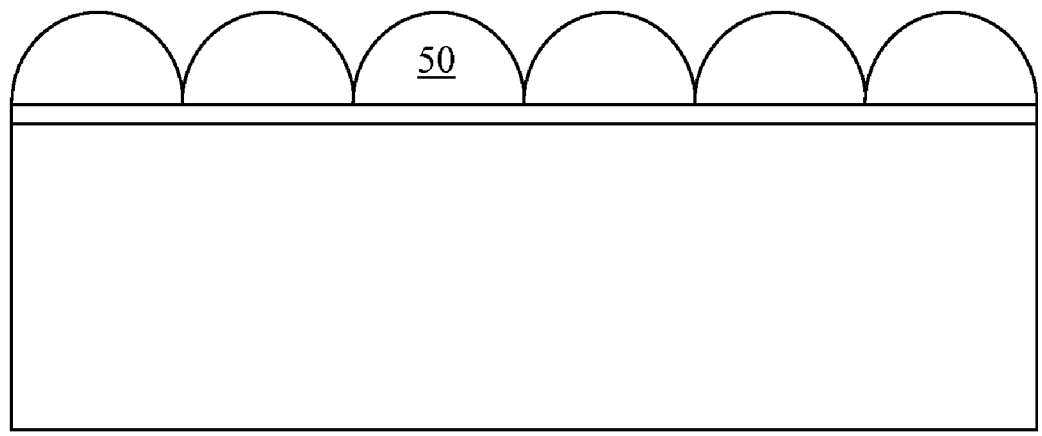

Surface migration of silicon atoms in an amorphous silicon layer during anneal at reduced pressures tends to form hemispherical grain (HSG) silicon grown around the nucleation sites provided by silicon nuclei deposited on the surface. Turning to FIG. 1a, silicon grains 30, growing from deposited silicon nuclei, will increase in size, consuming amorphous silicon layer 40, as shown in FIG. 1a. The resulting polysilicon thin film 50, shown in FIG. 1b, will have a rough, uneven surface. Such a surface maximizes surface area, which is advantageous for formation of capacitor electrodes.

If, instead, such a polysilicon thin film is to be used, for example, to form the channel of a TFT device, such roughness is not desirable. A smoother thin film will provide less variability between devices in an array.

The present invention is a novel method to enhance the grain size of polysilicon films while preventing HSG formation. Briefly, the technique calls for embedding deposited silicon nuclei in a matrix of amorphous silicon, for example between two layers of amorphous silicon, followed by annealing to induce growth of grains. "Deposited" silicon nuclei are silicon nuclei that are created by a deposition process, as opposed to those produced by anneal, ion implantation, or some other process. Conditions (for example pressure, temperature, and gases flowed) are changed to prevent conversion of the first layer of amorphous silicon to a discontinuous HSG film before the deposition of the second layer of amorphous silicon. Crystallization thus takes place from nucleation sites in the bulk, rather than on the surface, resulting in a uniform, continuous film.

Figure 2A:
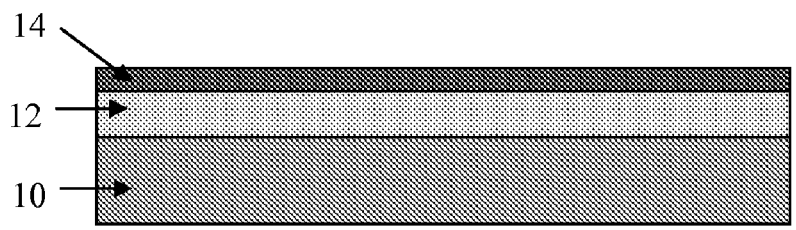
FIG. 2a through FIG. 2d illustrate stages of formation of a large-grained polysilicon film according to the present invention.

Deposition of amorphous silicon can begin with any suitable substrate. Turning to FIG. 2a, in this example the substrate 10 can be any dielectric or any semiconductive material, such as, for example, a bulk silicon wafer. CMOS or other circuits may be formed in the substrate. A dielectric layer 12 may overlie the substrate 10. Clearly other substrates may be used, and dielectric layer 12 may or may not be present, as may other additional layers.

Preferred temperature, pressure, and other aspects of condition are provided in this description to assist the skilled practitioner in practicing the invention. It will be understood, however, that temperatures and pressures reported by instruments used in processing will vary depending on calibration, type of equipment, and even features of the location of a facility, such as its altitude. The skilled practitioner will be aware of these routine variations, and will be accustomed to compensating accordingly.

Amorphous silicon layer 14, as shown in FIG. 2a, can be deposited by low pressure chemical vapor deposition (LPCVD) or any other method known in the art. It can be about 50 to about 1500 angstroms thick, preferably about 500 to about 1000 angstroms thick, more preferably about 500 angstroms thick. Any conditions that will create an amorphous film can be used; for example, deposition can take place at a temperature ranging from about 460 to about 550 degrees Celsius, preferably 490 to 510 degrees. Pressure can vary widely and can be any pressure known in the art for successful formation of amorphous silicon, preferably between about 200 mTorr and atmospheric pressure. At higher temperatures, closer to 550 degrees, deposition will proceed faster, improving throughput, but the likelihood of unwanted formation of silicon nuclei increases. Higher pressure, for example about 1 Torr, may be used in conjunction with higher temperature to inhibit formation of nuclei. One advantageous combination of temperature and pressure is, for example, about 500 degrees C. and about 700 mTorr. The skilled practitioner will balance the need for increased throughput with the need to inhibit formation of nuclei and choose temperature and pressure accordingly. Any known source gas can be used, for example $SiH_4$ or $Si_2H_6$. Any appropriate commercial or other system can be used, for example an ASML RVP-300 LPCVD system.

The next deposition step, deposition of silicon nuclei, is preferably performed at higher temperature. While the temperature is raised, the flow of $SiH_4$ is preferably stopped. An inert gas such as nitrogen can be flowed during this time. Increasing pressure during this time, for example to about 1 Torr or higher, helps inhibit premature formation of nuclei.

Figure 2B:
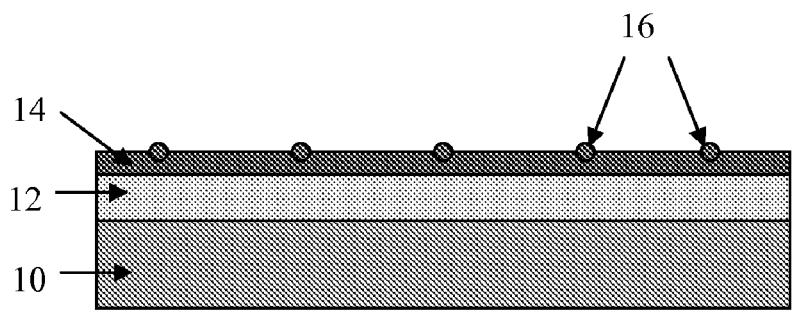

Once the temperature has reached the desired level for deposition of silicon nuclei, preferably between about 550 and about 590 degrees, more preferably between about 570 and about 580 degrees, silicon nuclei 16 are deposited on amorphous layer 14, as shown in FIG. 2b. The substrate can be moved to another reactor for deposition of nuclei, but nuclei deposition preferably takes place in the same reactor, reducing processing time and the danger of contamination. Deposition of silicon nuclei can be accomplished by any process known in the art. As noted earlier, higher pressure inhibits formation of nuclei, so if deposition of nuclei is performed at lower temperatures, near 550 degrees, pressure should not be too high, as is well known in the art. Advantageous pressures are less than 200 mTorr. Any appropriate source gas can be used for the nuclei, including $SiH_4$ or $Si_2H_6$. Advantageous conditions for deposition of silicon nuclei include flowing $SiH_4$ at a temperature of about 570 to about 580 degrees Celsius and a pressure of about 45 mTorr.

The silicon nuclei, also sometimes referred to in the art as crystallites, grains, or seeds, are single crystals of silicon which will serve as nuclei for the silicon grains of enhanced size to be grown during the anneal step to come. The size of these nuclei is the size required to achieve this purpose. If the silicon nuclei are too small, they may not grow during anneal. If they are too large, they will tend to be polycrystalline, rather than single crystal, increasing the number of grains in the finished product and thus decreasing average grain size. For the purposes of the present invention, the silicon nuclei deposited should be between about 0.05 micron and about 0.1 micron in diameter. Inevitably, some small number of these silicon nuclei may not be single crystal, but this fraction should be kept to a minimum, preferably about 20 percent or less.

Several factors should be considered in selecting deposition conditions. Density of the deposited silicon nuclei increases with increased temperature and with increased pressure. Deposition time should be brief so that crystallization does not begin. At lower pressure, deposition of nuclei is more uniform, due to enhancement of the diffusion process.

Figure 3A:
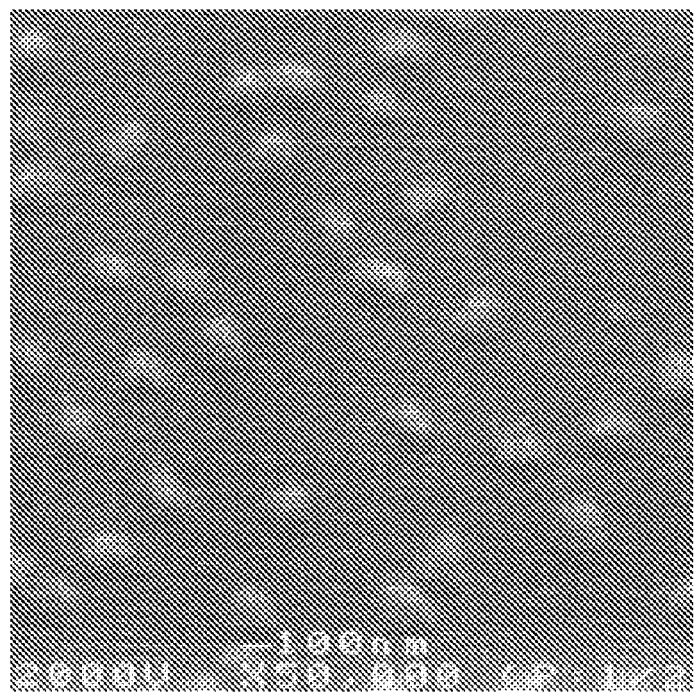
FIG. 3a and FIG. 3b show density of silicon nuclei at different deposition temperatures.
Figure 3B:
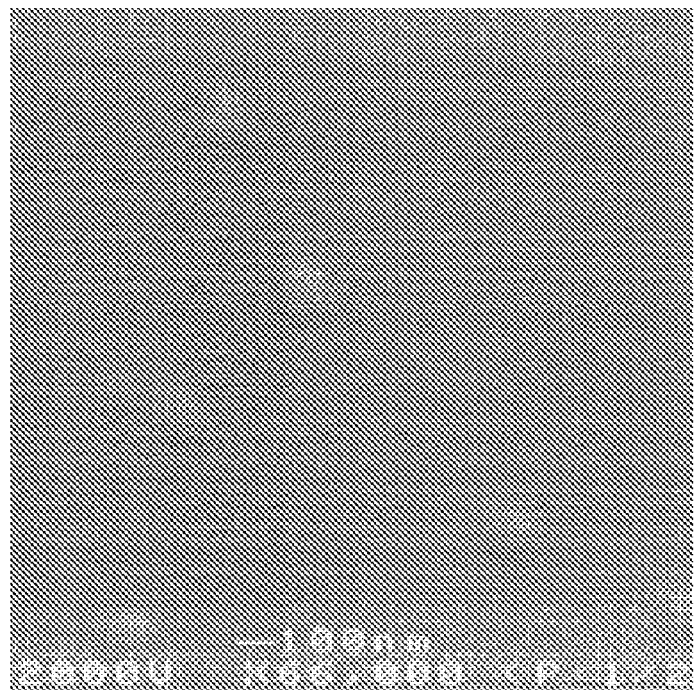

Higher density of nuclei clearly leads to higher density of nucleation sites, and thus faster completion of crystallization, which gives the advantage of faster, less costly processing. Lower density of nuclei, on the other hand, means fewer nucleation sites and slower completion of crystallization, but results in larger grains. With longer deposition time, more nuclei are deposited, also leading to higher density. Deposition time, temperature, and pressure can be selected for desired results, balancing grain size versus anneal time. A preferred density, which in ideal conditions will produce a grain size of 1 micron, is about $7.8 \times 10^7$ nuclei/cm$^2$. Advantageous conditions include, for example, depositing silicon nuclei from $SiH_4$ for one minute at about 45 mTorr with a temperature between about 550 to about 590 degrees Celsius, preferably about 570 to about 580 degrees Celsius. FIG. 3a shows a plan-view scanning electron microscope micrograph of silicon nuclei after one minute of deposition at 45 mTorr at 580 degrees Celsius; the same deposition with temperature at 570 degrees Celsius is shown in FIG. 3b. As noted, density of silicon nuclei is higher at higher temperature.

Next, conditions should be changed to substantially prevent conversion of the first amorphous layer 14 to HSG before deposition of the second amorphous layer, described below.

If the temperature remains high too long, grains will begin to form. To avoid this, once deposition of silicon nuclei is complete, conditions are rapidly changed to inhibit grain growth. The temperature should be lowered as quickly as possible below about 550 degrees Celsius, preferably to about 500 degrees Celsius.

In conventional reactors, temperature change is not instantaneous. Pressure, on the other hand, can be changed very quickly, and pressures higher than about 700 mTorr inhibit grain growth. In one embodiment, $SiH_4$ flow is stopped, and temperature is reduced over a period of thirty minutes while flowing, for example, 1 liter of an inert gas, preferably nitrogen, per minute, while pressure is increased from about 45 mTorr to about 1 Torr in about 30 seconds.

If deposition is performed in a rapid thermal reactor in which temperature can be lowered much more quickly, it may be possible to substantially prevent HSG with the temperature change alone. In this case the increase of pressure is less crucial.

Though steps are taken to prevent HSG formation, in practice, some small degree of grain growth may take place at this stage. A small degree of growth is acceptable, so long as, by the time deposition of the second amorphous layer begins (in the next step), the nuclei have grown to a size no more than about 0.1 micron in diameter. This is adequate to prevent conversion of the first amorphous layer to HSG.

Figure 2C:
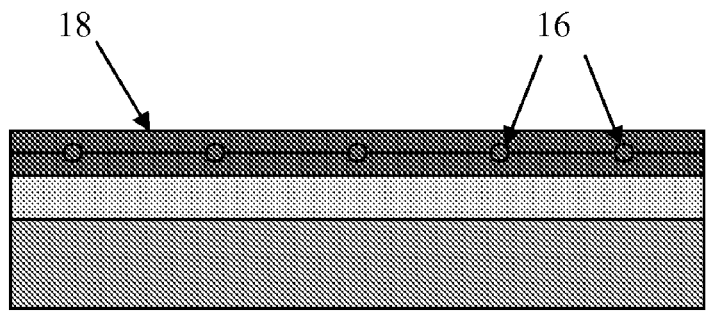

Next a second layer of amorphous silicon 18 is deposited, as shown in FIG. 2c. Deposition conditions can be the same as those used to deposit amorphous layer 14, or different, as desired, as long as amorphous silicon is deposited. The range of thicknesses for layer 18 is the same as for layer 14, except the combined thickness should preferably be about 2000 angstroms thick or less. In a preferred embodiment, each amorphous layer, 14 and 18, is about 500 angstroms thick. The substrate can be moved to another reactor for deposition of the amorphous layer 18, but, as before, preferably takes place in the same reactor, reducing processing time and the danger of contamination.

After deposition of amorphous layer 18 is complete, the substrate and silicon layers with embedded nuclei should be annealed to induce growth of grains. The anneal should be performed preferably in nitrogen (though other inert gases may be used) at a temperature between about 500 and about 600 degrees Celsius, preferably about 540 degrees Celsius. At higher temperature, grain growth will proceed more quickly, but the higher temperature may trigger bulk nucleation such that the amorphous silicon itself will nucleate, rather than grains growing only from the deposited nuclei. At lower temperature such bulk nucleation is less likely, but crystallization takes longer to complete. The silicon should crystallize completely to guarantee good device performance. The skilled practitioner will balance these factors and select anneal temperature accordingly.

The substrate can be moved to another reactor for the anneal step, but preferably takes place in the same reactor, reducing processing time and the danger of contamination.

Figure 2D:
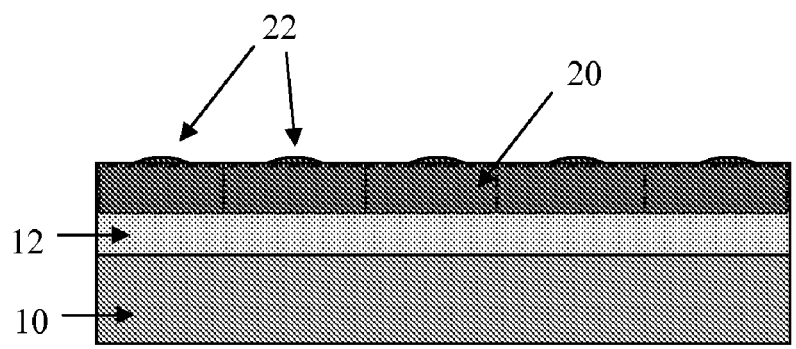

Crystallization proceeds from the deposited silicon nuclei which are embedded in a matrix of amorphous silicon, formed by the amorphous layers 14 and 18, below and above the nuclei 16. For a nucleus to be "embedded in a matrix" of a material means for the nucleus to be surrounded on all sides by that material and substantially in contact with it. Because the nuclei are embedded rather than on the surface, and because grain growth is inhibited until the nuclei are embedded (until the second amorphous layer is deposited), the grains grow from the bulk rather than from the surface. Grain growth occurs without the high surface mobility of silicon atoms that characterizes growth of HSG silicon, creating a smooth, relatively uniform film 20 with few defects, as shown in FIG. 2d. While HSG does not occur, there may be some surface roughness 22 associated with nucleation sites. This surface roughness, if is does occur, can be removed by chemical mechanical polishing if it is not desirable for the intended device application.

EXAMPLE

Figure 4:
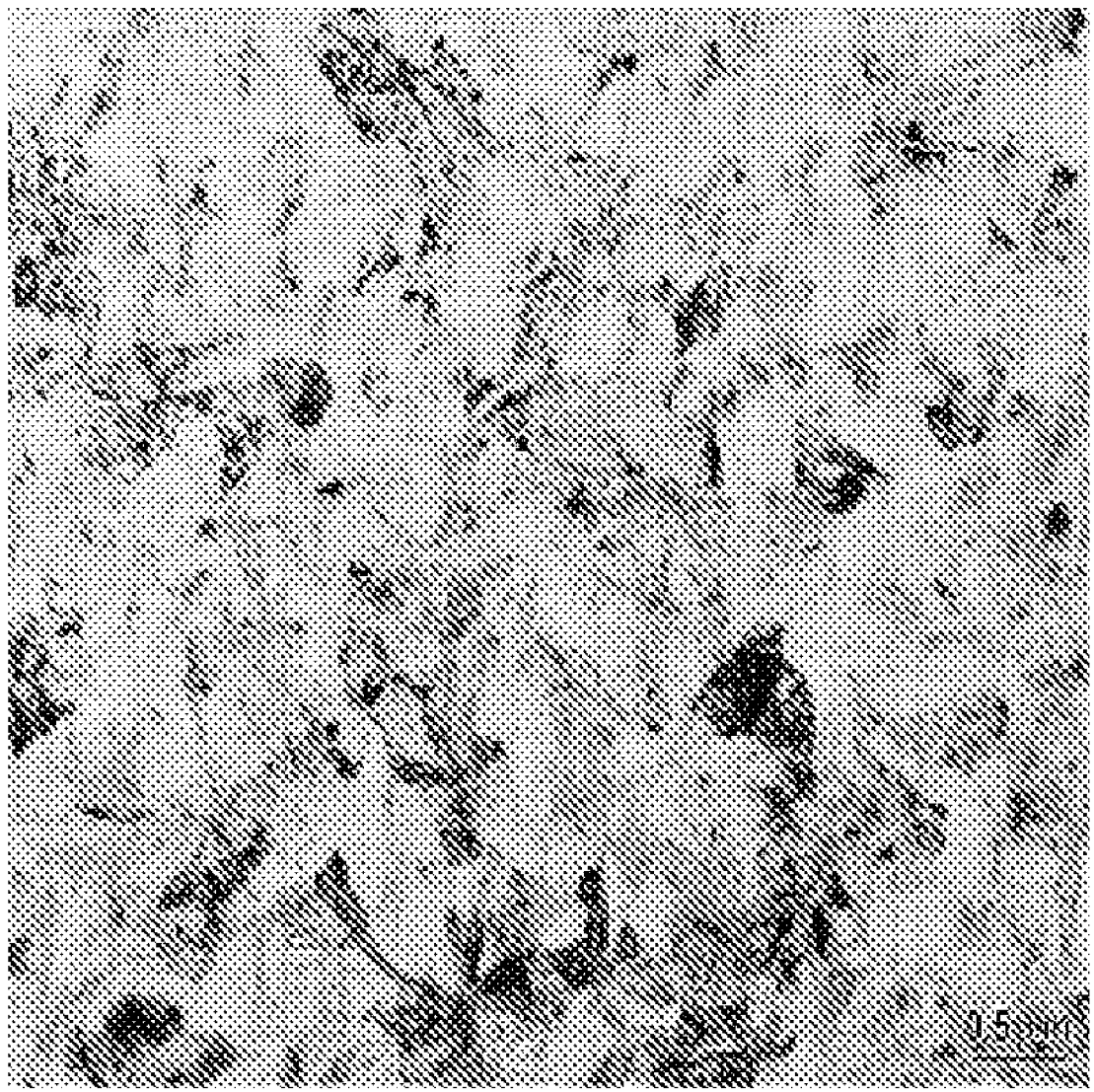
FIG. 4 is a transmission electron microscope (TEM) image of a polysilicon film formed according to the present invention.

FIG. 4 is a TEM top view image of a thin film crystallized according to the present invention. The conditions used to create the thin film shown in FIG. 4 will be described in detail.

Deposition was performed on a silicon wafer. On the silicon wafer was a layer of $SiO_2$. Deposition of the first amorphous layer on the $SiO_2$ was performed in an ASML RVP-300 LPCVD system. 100 percent $SiH_4$ was flowed at 500 sccm, at a temperature of 500 degrees Celsius and a pressure of 700 mTorr for one hour, twenty minutes, and twenty-six seconds, resulting in about 500 angstroms of amorphous silicon.

Next the flow of $SiH_4$ was stopped. Pressure was increased to 1 Torr and nitrogen was flowed at 120 sccm while the temperature was raised to 580 degrees Celsius.

The desired temperature of 580 degrees was reached after about 30 minutes. The flow of nitrogen was stopped, the pressure was dropped to 45 mTorr, and $SiH_4$ was flowed at 120 sccm for one minute.

After one minute, the flow of $SiH_4$ was again stopped and pressure was raised to 1 Torr to prevent HSG formation. Nitrogen was flowed at 500 sccm while the temperature was dropped to 500 degrees Celsius. Two hours was allowed for the temperature to stabilize completely.

After two hours, the pressure was lowered to 700 mTorr and $SiH_4$ was flowed at 500 sccm at 500 degrees Celsius for one hour, twenty minutes, and twenty-six seconds, resulting in a second amorphous layer about 500 angstroms thick.

The wafer was removed from the LPCVD reactor at this point for examination, though such removal is not necessary, nor is it advantageous under production conditions. The wafer was returned to the reactor and annealed at 540 degrees Celsius at atmospheric pressure in a nitrogen atmosphere for 24 hours.

FIG. 4 shows the crystallized film after anneal; complete crystallization has occurred. The wafer was observed after 24 hours of anneal, though crystallization may actually have completed earlier.

In the film shown in FIG. 4, most or all of the grains were 0.2 microns or larger; the average size was about 0.6 microns, with some grains as large as 1 micron. As described earlier, larger or smaller grains could be achieved according to the conditions chosen for deposition of silicon nuclei and for the anneal.

The specific values provided in the description of the present invention assume that amorphous silicon layers 14 and 18 are undoped. The method of depositing an amorphous layer, depositing silicon nuclei, suppressing HSG formation, depositing a second amorphous layer, and inducing grain growth can also be used when the amorphous silicon is doped with phosphorus. Phosphorus is used to create N-type silicon. Phosphorus atoms behave as nucleation inhibitors, so the conditions separating formation of amorphous and of polycrystalline silicon will be changed in known ways according to the amount of dopant. The skilled practitioner will adjust temperature, pressure, and other conditions accordingly.

The method is not relevant to conventionally produced boron-doped silicon, however. Silicon doped with boron atoms to create P-type silicon will behave differently, as the boron atoms themselves promote nucleation. Conventionally in-situ boron-doped silicon, if deposited at the temperatures and pressures disclosed herein for deposition of undoped amorphous silicon, will be polycrystalline rather than amorphous.

A thin film crystallized according to the present invention can be used to make TFTs using standard techniques known in the art. If a charge storage region is included, TFTs made from a thin film formed according to the present invention can be used as memory cells. Examples of TFT memory cells and arrays that can be made using large-grain thin films according to the present invention are the TFT embodiments disclosed in Walker et al., U.S. patent application Ser. No. 10/334649, "Formation of Thin Channels for TFT Devices to Ensure Low Variability of Threshold Voltages," filed Dec. 31, 2002, which is hereby incorporated by reference in its entirety. Charge storage regions can be ONO-type or floating gate. An ONO-type charge storage region is one that stores charge in the manner of a SONOS device, which comprises a tunneling layer, a charge trapping layer, and a blocking layer. Charge carriers tunnel through a tunneling layer, typically an oxide layer, and are trapped in a charge trapping layer, typically a nitride layer. The charge trapping layer is sandwiched between the tunneling layer and the blocking layer, which is also typically an oxide layer. It will be understood that other dielectric materials can be used for each of these layers as well.

TFT memory devices made from thin films formed according to the present invention can be used in monolithic three dimensional memory arrays of the type described in Lee et al., U.S. patent application Ser. No. 09/927648, "Dense Arrays and Charge Storage Devices, and Methods for Making Same," filed on Aug. 13, 2001; and in Scheuerlein et al., U.S. patent application Ser. No. 10/335078, "Programmable Memory Array Structure Incorporating Series-Connected Transistors and Methods for Fabrication and Operation of Same," filed Dec. 31, 2002, both of which are hereby incorporated by reference herein as though included in their entirety.

Other monolithic three dimensional memory arrays are write-once memories in which memory cells comprise antifuses and diodes or diode components rather than TFTs. The diode-antifuse combination of the memory cell initially does not conduct and is considered to be in an unprogrammed state. With application of high voltage, the antifuse irreversibly becomes conductive, and the cell is programmed. Examples of such memories are found in Johnson et al., U.S. Pat. No. 6,034,882, "Vertically stacked field programmable nonvolatile memory and method of fabrication"; in Johnson, U.S. Pat. No. 6,525,953, "Vertically stacked field programmable nonvolatile memory and method of fabrication"; and in Knall et al., U.S. Pat. No. 6,420,215, "Three-dimensional memory array and method of fabrication"; all of which are hereby incorporated by reference herein as though included in their entirety. The diodes and diode components of these memories comprise polysilicon, and the performance of such memories can be enhanced by using the methods of the present invention to create that polysilicon with larger grain size.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for crystallizing silicon, comprising:
    depositing a first layer of amorphous silicon;
    depositing silicon nuclei on the first layer of amorphous silicon, wherein the silicon nuclei are deposited at a density of about $7.8 \times 10^7$ nuclei/cm$^2$;
    depositing a second layer of amorphous silicon over the first layer and the nuclei, wherein conversion of the first layer to hemispherical grains before deposition of the second layer is substantially prevented; and
    annealing the first and second layers of amorphous silicon to induce crystallization.

2. The method of claim 1, wherein crystallization occurs through solid phase crystallization.

3. The method of claim 1, wherein the first layer of amorphous silicon as deposited is about 500 angstroms thick or less.

4. The method of claim 1, wherein the second layer of amorphous silicon as deposited is about 500 angstroms thick or less.

5. The method of claim 1, wherein all three depositing steps and the annealing step all take place in the same reactor.

6. The method of claim 1, wherein, during the step of depositing silicon nuclei, some of the silicon nuclei are between about 0.05 micron and about 0.1 micron in diameter.

* * * * *